United States Patent [19]

Sommer et al.

[11] Patent Number: 5,599,201
[45] Date of Patent: Feb. 4, 1997

[54] CIRCUIT ASSEMBLY HAVING STAMPED CIRCUITRY WITH A WIRE TRAP

[75] Inventors: Edward S. Sommer, Addison; Richard R. Edgley, Elmhurst; Michael D. Driscoll, Naperville, all of Ill.

[73] Assignee: Molex Incorporated, Lisle, Ill.

[21] Appl. No.: 438,127

[22] Filed: May 8, 1995

[51] Int. Cl.⁶ .................................................. H01R 11/20
[52] U.S. Cl. ............................................ 439/441; 439/439
[58] Field of Search ...................................... 439/439, 441, 439/942, 790, 794, 796, 55, 931, 719, 374

[56] References Cited

U.S. PATENT DOCUMENTS

| | | | |
|---|---|---|---|
| 4,036,545 | 7/1977 | Mysiak et al. | |
| 4,099,822 | 7/1978 | Carlisle et al. | 439/942 X |
| 4,130,331 | 12/1978 | Neff et al. | |
| 4,149,766 | 4/1979 | Stenz et al. | 439/441 |
| 4,150,863 | 4/1979 | Krafthefer et al. | 439/80 X |
| 4,209,218 | 6/1980 | Kosten et al. | 439/942 X |
| 4,895,536 | 1/1990 | Gingerich et al. | 439/885 |
| 4,978,315 | 12/1990 | Edgley et al. | 439/441 |
| 5,320,558 | 6/1994 | von Roretz | 439/441 |

FOREIGN PATENT DOCUMENTS 7-272812  10/1995  Japan .

OTHER PUBLICATIONS

A Sketch of Molex Incorporated Part No. 42732.
A Molex Incorporated Brochure Entitle "Stamped Circuitry Technology".

*Primary Examiner*—Gary E. Elkins
*Assistant Examiner*—Christopher J. McDonald
*Attorney, Agent, or Firm*—Stephen Z. Weiss

[57] ABSTRACT

A circuit assembly is provided for terminating an insulated electrical wire having a central conductive core. A generally rigid dielectric base has circuit-receiving channels formed therein. Stamped and formed conductive circuitry is mounted on the base, with circuit portions located in the channels, and with at least one connecting portion for terminating the insulated electrical wire. The connection portion is a wire trap for receiving and trapping the conductive core of the electrical wire. The base includes a wire guide located adjacent the wire trap to guide the electrical wire for insertion of the conductive core into the wire trap and for providing stress relief for the electrical wire.

9 Claims, 2 Drawing Sheets

CIRCUIT ASSEMBLY HAVING STAMPED CIRCUITRY WITH A WIRE TRAP

FIELD OF THE INVENTION

This invention generally relates to the art of electrical connections and, particularly, to a circuit assembly having a stamped and formed conductive circuitry mounted on a base, with the circuitry including a wire trap.

BACKGROUND OF THE INVENTION

There are a variety of electrical connection applications wherein stamped and formed electrical circuitry, including lead frames, are mounted on dielectric bases or housings for terminating leads of various electrical devices. Such applications can range from switches or connectors to refrigerator ice making apparatus.

Typically, such circuit assemblies include stamped and formed conductive circuitry mounted to a wire-insertion face of a dielectric housing or base. The base may include circuit-receiving channels for locating and receiving circuit portions of the conductive circuitry. The central conductive cores of insulated electrical wires are connected to the conductive circuitry by connecting portions at various terminating points of the circuitry. For instance, lead wires from a motor may be connected at terminating points to integral connecting portions of the circuitry.

Heretofore, the insulated electrical wires typically have been terminated to the circuitry by insulation displacement connecting portions of the circuitry. The circuitry may even include anti-overstress portions for receiving the insulated electrical wires to hold the wires horizontally in the insulation displacement connecting portions of the circuitry. Special pushing tools usually are required to provide enough force to terminate the wires into the insulation displacement connecting portions and/or locating the wires in the anti-overstress portions of the circuitry. Problems of excessive insertion forces and the requirement of using special tools have discouraged the use of this type of circuitry for many years.

The present invention is directed to solving the above problems by providing a circuit assembly which uses stamped and formed conductive circuitry requiring minimal wire insertion forces and includes a simple wire guide means that also provides strain relief.

SUMMARY OF THE INVENTION

An object, therefore, of the invention is to provide a new and improved circuit assembly for terminating an insulated electrical wire having a central conductive core.

In the exemplary embodiment of the invention, the circuit assembly includes a generally rigid dielectric base having circuit-receiving channels formed therein. Stamped and formed conductive circuitry is mounted on the base, with circuit portions located in the channels, and with at least one connecting portion for terminating the insulated electrical wire.

The invention contemplates that the connecting portions of the conductive circuitry include a wire trap for receiving and trapping the conductive core of the electrical wire with minimal insertion forces. The base includes a wire guide located adjacent the wire trap to guide the electrical wire for insertion of the conductive core into the wire trap and for providing stress relief for the electrical wire.

As disclosed herein, the base is molded of plastic material, and the wire guide comprises an integral portion of the base. The wire guide is formed as an upstanding semi-cylindrical post-like member sized for embracing the outer insulation of the insulated electrical wire. The wire trap comprises an upstanding integral portion of the stamped and formed conductive circuitry.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
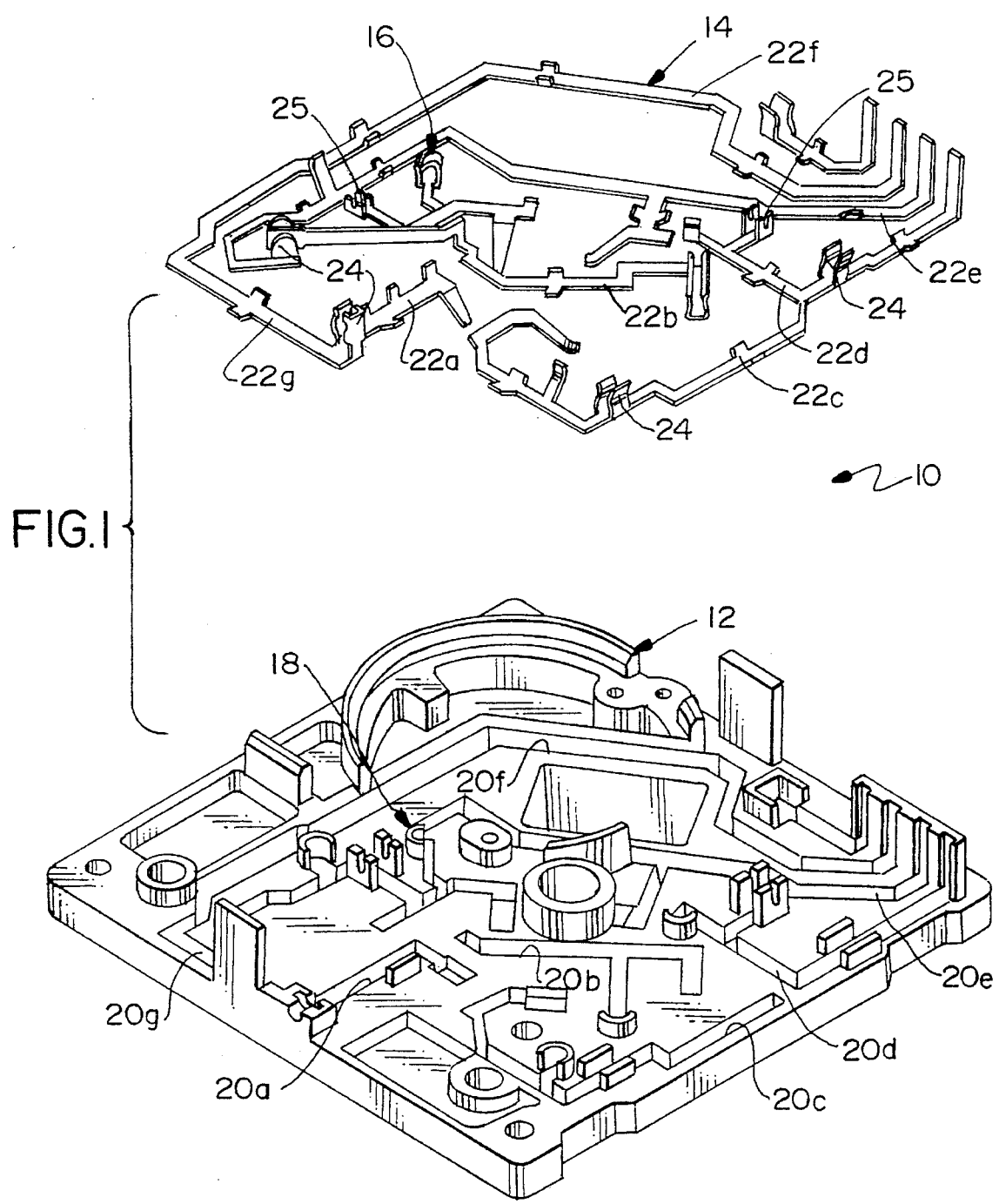
FIG. 1 is an exploded perspective view of a circuit assembly embodying the concepts of the invention.

Referring to the drawings in greater detail, and first to FIG. 1, the invention is embodied in a circuit assembly, generally designated 10, which is adapted for terminating at least one insulated electrical wire having a central conductive core. The wire will be seen in subsequent figures. Circuit assembly 10 includes a generally rigid dielectric base, generally designated 12, and stamped and formed conductive circuitry, generally designated 14. Circuitry 14 includes a wire trap, generally designated 16, and base 12 includes a wire guide, generally designated 18, with the wire guide and wire trap forming the crux of the invention herein.

More particularly, rigid dielectric base 12 can be considered a dielectric housing having a plurality of circuit-receiving channels, some of which have been identified as 20a–20g. The base includes quite a number of other channels, upstanding bosses and the like which will not be described herein because they do not form part of the invention and are well known in the art. Suffice it to say, base 12 preferably is molded of a dielectric plastic material, and wire guide 18 preferably comprises an integral portion of the base.

Stamped and formed conductive circuitry 14 is stamped and formed from conductive metal strip material and is mounted on base 12, with circuit portions 22a–22g located in channels 20a–20g, respectively, of the base. Like the base, conductive circuitry 14 includes a number of other circuit portions as well as a plurality of connecting portions 24, which will not be described in detail herein because they do not form part of the invention and are well known in the art. Suffice it to say, wire trap 16 comprising an upstanding integral portion of the stamped and formed conductive circuitry.

Figure 2:
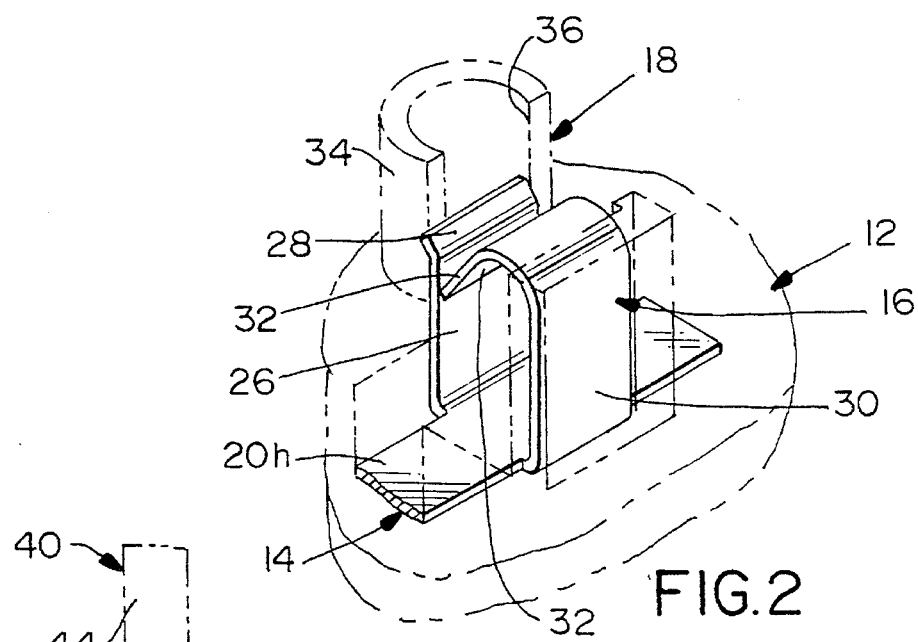
FIG. 2 is an enlarged fragmented perspective view of the wire trap and wire guide of the invention.
Figure 3:
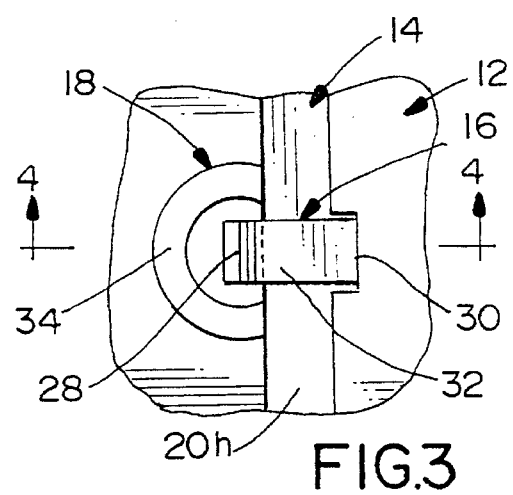
FIG. 3 is a fragmented top plan view of the wire trap and wire guide.

Referring to FIGS. 2 and 3 in conjunction with FIG. 1, wire trap 16 includes an upwardly projecting planar arm 26 having an outwardly flared flange 28 at the upper distal end thereof. A second planar arm 30 projects upwardly, generally parallel to arm 26, and includes a reversely bent flange 32 at the distal end thereof for trapping a conductive wire between the edge of reversely bent flange 32 and planar arm 26, as will be described hereinafter. It can be seen that planar arms 26 and 30 are integral with and project upwardly from a circuit portion 20h of stamped and formed conductive circuitry 14.

Still referring to FIGS. 2 and 3 in conjunction with FIG. 1, wire guide 18 is molded integrally with base 12, as stated above. The wire guide is formed by an upstanding semi-cylindrical post-like member 34 which defines an open mouth 36 facing wire trap 16. The wire guide is located immediately adjacent the wire trap, and the inside of the semi-cylindrical post-like member is sized for embracing the outer insulation of an insulated electrical wire adapted for termination in wire trap 16.

Figure 4:
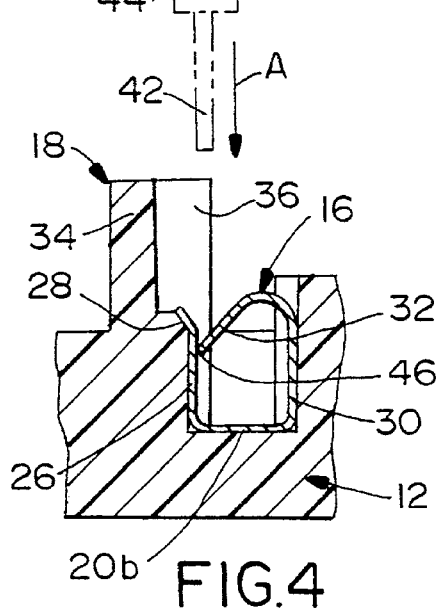
FIG. 4 is a vertical section taken generally along line 4—4 of FIG. 3, with the insulated electrical wire spaced above the wire trap and wire guide.
Figure 5:
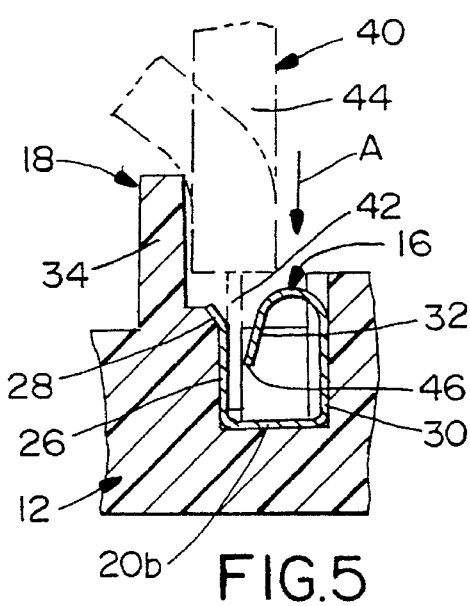
FIG. 5 is a view similar to that of FIG. 4, with the insulated electrical wire fully inserted into the wire trap and wire guide.

More particularly, referring to FIGS. 4 and 5, an insulated electrical wire, generally designated 40, is shown in phantom and includes a central conductive core 42 surrounded by an outer insulating cladding or sheath 44. It can be seen that the insulation is stripped away from a projecting portion of the central conductive core. The insulated electrical wire is terminated in wire trap 16 by inserting conductive core 42 into the wire trap in the direction of arrow "A" (FIG. 4). It can be seen in FIG. 4 that a distal edge 46 of reversely bent flange 32 of the wire trap is in engagement with planar arm 26.

FIG. 5 shows insulated electrical wire 40 having been fully inserted into wire trap 16 in the direction of arrow "A" until the tip of conductive core 42 engages circuit portion 20h which spans the bottom of the wire trap. It can be seen that the conductive core is sandwiched between planar arm 26 and edge 46 of reversely bent flange 32. Therefore, the conductive core of the insulated electrical wire is "trapped" by wire trap 16 and it is very difficult to pull the core back out of the wire trap because of the oblique orientation of reversely bent flange 32.

FIG. 5 also shows how the outer insulated portion 44 of electrical wire 40 seats within semicylindrical wire guide 18. The wire guide not only performs the function of guiding the insulated wire and, thus, conductive core 42 into the wire trap, but the wire guide acts as an anti-overstress means should excessive forces be exerted on the insulated wire to bend the wire at least in directions toward the wire guide, as shown by the bent wire in FIG. 5.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. In a circuit assembly for terminating an insulated electrical wire having a central conductive core, the assembly including a generally rigid dielectric base having circuit-receiving channels formed therein, and stamped and formed conductive circuitry mounted on the base with circuit portions located in said channels said circuitry generally located in one plane of the base and at least one connecting portion for terminating the insulated electrical wire, wherein the improvement comprises:

said connecting portion of the conductive circuitry, formed integral with the conductive circuitry, being a wire trap for receiving and trapping the conductive core of the insulated electrical wire, and said base including a wire guide located adjacent the wire trap extending perpendicularly from the plane of the base to guide the insulated electrical wire for insertion of the conductive core into the wire trap perpendicular to the plane of the base and provide stress relief for the insulated electrical wire.

2. In a circuit assembly as set forth in claim 1, wherein said base is molded of plastic material and said wire guide comprises an integral portion of the base.

3. In a circuit assembly as set forth in claim 1, wherein said wire guide is sized for embracing at least a portion of the outer insulation of the insulated electrical wire.

4. In a circuit assembly as set forth in claim 1, wherein said wire guide comprises an upstanding semicylindrical post-like member.

5. In a circuit assembly for terminating an electrical wire, including a generally rigid dielectric base, and stamped and formed conductive circuitry mounted on the base said circuitry generally located in one plane of the base with at least one connecting portion for terminating the electrical wire, wherein the improvement comprises:

said connecting portion of the conductive circuitry, formed integral with the conductive circuitry, being a wire trap for receiving and trapping the electrical wire, and said base including a wire guide located adjacent the wire trap extending perpendicularly from the plane of the base to guide the electrical wire perpendicular to the plane of the base into the wire trap and provide stress relief for the electrical wire.

6. In a circuit assembly as set forth in claim 5, wherein said base is molded of plastic material and said wire guide comprises an integral portion of the base.

7. In a circuit assembly as set forth in claim 5, wherein said wire guide comprises an upstanding semicylindrical post-like member sized for embracing the electrical wire.

8. In a circuit assembly for terminating an insulated electrical wire having a central conductive core, the assembly including a generally rigid dielectric base having circuit-receiving channels formed therein, and stamped and formed conductive circuitry mounted on the base with circuit portions located in said channels said circuitry generally located in one plane of the base and at least one connecting portion for terminating the insulated electrical wire, wherein the improvement comprises:

said connecting portion of the conductive circuitry formed integral with the conductive circuitry, being a wire trap for receiving and trapping the conductive core of the insulated electrical wire, the wire trap being an upstanding integral portion of the stamped and formed conductive circuitry, and said base being molded of plastic material and including an integral wire guide located adjacent the wire trap extending perpendicularly from the plane of the base to guide the insulated electrical wire for insertion of the conductive core into the wire trap perpendicular to the plane of the base and provide stress relief for the insulated electrical wire, the wire guide being an upstanding semi cylindrical post-like member sized for embracing the outer insulation of the insulated electrical wire.

9. In a circuit assembly as set forth in claim 8 wherein said wire trap includes a pair of upstanding arms integral with one of the circuit portions of the stamped and formed conductive circuitry, the central conductive core of the insulated electrical wire being insertable between the arms.

* * * * *